(12) United States Patent
Cich et al.

(10) Patent No.: US 8,994,033 B2
(45) Date of Patent: Mar. 31, 2015

(54) CONTACTS FOR AN N-TYPE GALLIUM AND NITROGEN SUBSTRATE FOR OPTICAL DEVICES

(71) Applicant: Soraa, Inc., Fremont, CA (US)

(72) Inventors: Michael J. Cich, Fremont, CA (US); Kenneth John Thomson, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 9 days.

(21) Appl. No.: 13/937,338

(22) Filed: Jul. 9, 2013

(65) Prior Publication Data

US 2015/0014695 A1    Jan. 15, 2015

(51) Int. Cl.
*H01L 29/15* (2006.01)
*H01L 33/32* (2010.01)
*H01L 33/22* (2010.01)

(52) U.S. Cl.
CPC .............. *H01L 33/32* (2013.01); *H01L 33/22* (2013.01)
USPC .......... 257/76; 257/13; 257/E33.012; 438/34; 438/46

(58) Field of Classification Search
CPC ................................ H01L 33/32; H01L 33/22
USPC ....................... 257/13, 76, 33.012; 438/46, 34
See application file for complete search history.

(56) References Cited

U.S. PATENT DOCUMENTS

| | | |
|---|---|---|
| 4,065,688 A | 12/1977 | Thornton |
| 4,066,868 A | 1/1978 | Witkin et al. |
| 4,350,560 A | 9/1982 | Helgeland et al. |
| 4,581,646 A | 4/1986 | Kubodera |
| 4,870,045 A | 9/1989 | Gasper et al. |
| 5,169,486 A | 12/1992 | Young et al. |
| 5,331,654 A | 7/1994 | Jewell et al. |

(Continued)

FOREIGN PATENT DOCUMENTS

| | | |
|---|---|---|
| EP | 2381490 | 10/2011 |
| JP | 06-334215 | 12/1994 |

(Continued)

OTHER PUBLICATIONS

USPTO Notice of Allowance for U.S. Appl. No. 12/785,953 dated Mar. 20, 2014 (8 pages).

(Continued)

*Primary Examiner* — Jami M Valentine
(74) *Attorney, Agent, or Firm* — Kilpatrick Townsend & Stockton LLP

(57) ABSTRACT

A method for fabricating LED devices. The method includes providing a gallium and nitrogen containing substrate member (e.g., GaN) comprising a backside surface and a front side surface. The method includes subjecting the backside surface to a polishing process, causing a backside surface to be characterized by a surface roughness, subjecting the backside surface to an anisotropic etching process exposing various crystal planes to form a plurality of pyramid-like structures distributed spatially in a non-periodic manner on the backside surface, treating the backside surface comprising the plurality of pyramid-like structures, to a plasma species, and subjecting the backside surface to a surface treatment. The method further includes forming a contact material comprising an aluminum bearing species or a titanium bearing species overlying the surface-treated backside to form a plurality of LED devices with the contact material.

9 Claims, 5 Drawing Sheets

(56) References Cited

U.S. PATENT DOCUMENTS

| | | | |
|---|---|---|---|
| 5,607,899 A | 3/1997 | Yoshida et al. | |
| 5,632,812 A | 5/1997 | Hirabayashi | |
| 5,764,674 A | 6/1998 | Hibbs-Brenner et al. | |
| 5,813,753 A | 9/1998 | Vriens et al. | |
| 6,335,771 B1 | 1/2002 | Hiraishi | |
| 6,498,355 B1 | 12/2002 | Harrah et al. | |
| 6,501,154 B2 | 12/2002 | Morita et al. | |
| 6,509,651 B1 | 1/2003 | Matsubara et al. | |
| 6,533,874 B1 | 3/2003 | Vaudo et al. | |
| 6,547,249 B2 | 4/2003 | Collins, III et al. | |
| 6,680,959 B2 | 1/2004 | Tanabe et al. | |
| 6,734,461 B1 | 5/2004 | Shiomi et al. | |
| 6,809,781 B2 | 10/2004 | Setlur et al. | |
| 6,853,010 B2 | 2/2005 | Slater, Jr. et al. | |
| 6,864,641 B2 | 3/2005 | Dygert | |
| 6,956,246 B1 | 10/2005 | Epler et al. | |
| 6,989,807 B2 | 1/2006 | Chiang | |
| 7,009,199 B2 | 3/2006 | Hall | |
| 7,012,279 B2 | 3/2006 | Wierer, Jr. et al. | |
| 7,081,722 B1 | 7/2006 | Huynh et al. | |
| 7,083,302 B2 | 8/2006 | Chen et al. | |
| 7,113,658 B2 | 9/2006 | Ide et al. | |
| 7,128,849 B2 | 10/2006 | Setlur et al. | |
| 7,253,446 B2 | 8/2007 | Sakuma et al. | |
| 7,279,040 B1 | 10/2007 | Wang | |
| 7,285,801 B2 | 10/2007 | Eliashevich et al. | |
| 7,303,630 B2 | 12/2007 | Motoki et al. | |
| 7,318,651 B2 | 1/2008 | Chua et al. | |
| 7,341,880 B2 | 3/2008 | Erchak et al. | |
| 7,348,600 B2 | 3/2008 | Narukawa et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,419,281 B2 | 9/2008 | Porchia et al. | |
| 7,470,938 B2 | 12/2008 | Lee et al. | |
| 7,483,466 B2 | 1/2009 | Uchida et al. | |
| 7,489,441 B2 | 2/2009 | Scheible et al. | |
| 7,560,981 B2 | 7/2009 | Chao et al. | |
| 7,622,742 B2 | 11/2009 | Kim et al. | |
| 7,733,571 B1 | 6/2010 | Li | |
| 7,816,238 B2 | 10/2010 | Osada et al. | |
| 7,858,408 B2 | 12/2010 | Mueller et al. | |
| 7,862,761 B2 | 1/2011 | Okushima et al. | |
| 7,871,839 B2 | 1/2011 | Lee et al. | |
| 7,884,538 B2 | 2/2011 | Mitsuishi et al. | |
| 7,906,793 B2 | 3/2011 | Negley | |
| 7,923,741 B1 | 4/2011 | Zhai et al. | |
| 8,044,412 B2 | 10/2011 | Murphy et al. | |
| 8,044,609 B2 | 10/2011 | Liu | |
| 8,142,566 B2 | 3/2012 | Kiyomi et al. | |
| 8,188,504 B2 | 5/2012 | Lee | |
| 8,198,643 B2 | 6/2012 | Lee et al. | |
| 8,207,548 B2 | 6/2012 | Nagai | |
| 8,207,554 B2 | 6/2012 | Shum | |
| 8,247,886 B1 | 8/2012 | Sharma et al. | |
| 8,247,887 B1 | 8/2012 | Raring et al. | |
| 8,252,662 B1 | 8/2012 | Poblenz et al. | |
| 8,269,245 B1 | 9/2012 | Shum | |
| 8,293,551 B2 | 10/2012 | Sharma et al. | |
| 8,310,143 B2 | 11/2012 | Van De Ven et al. | |
| 8,314,429 B1 | 11/2012 | Raring et al. | |
| 8,324,840 B2 | 12/2012 | Shteynberg et al. | |
| 8,350,273 B2 | 1/2013 | Vielemeyer | |
| 8,362,603 B2 | 1/2013 | Lim et al. | |
| 8,404,071 B2 | 3/2013 | Cope et al. | |
| 8,410,711 B2 | 4/2013 | Lin et al. | |
| 8,410,717 B2 | 4/2013 | Shteynberg et al. | |
| 8,431,942 B2 | 4/2013 | Butterworth | |
| 8,455,894 B1 | 6/2013 | D'Evelyn et al. | |
| 8,502,465 B2 | 8/2013 | Katona et al. | |
| 8,519,437 B2 | 8/2013 | Chakraborty | |
| 8,524,578 B1 | 9/2013 | Raring et al. | |
| 8,541,951 B1 | 9/2013 | Shum et al. | |
| 8,575,642 B1 | 11/2013 | Shum | |
| 8,575,728 B1 | 11/2013 | Raring et al. | |
| 8,674,395 B2 | 3/2014 | Shum | |
| 8,686,431 B2 | 4/2014 | Batres et al. | |
| 8,704,258 B2 | 4/2014 | Tasaki et al. | |
| 8,802,471 B1 * | 8/2014 | Cich et al. | 438/46 |
| 2001/0009134 A1 | 7/2001 | Kim et al. | |
| 2001/0022495 A1 | 9/2001 | Salam | |
| 2001/0043042 A1 | 11/2001 | Murazaki et al. | |
| 2001/0055208 A1 | 12/2001 | Kimura | |
| 2002/0070416 A1 | 6/2002 | Morse et al. | |
| 2002/0088985 A1 | 7/2002 | Komoto et al. | |
| 2002/0096994 A1 | 7/2002 | Iwafuchi et al. | |
| 2002/0127824 A1 | 9/2002 | Shelton et al. | |
| 2002/0155691 A1 | 10/2002 | Lee et al. | |
| 2002/0182768 A1 | 12/2002 | Morse et al. | |
| 2003/0000453 A1 | 1/2003 | Unno et al. | |
| 2003/0001238 A1 | 1/2003 | Ban | |
| 2003/0020087 A1 | 1/2003 | Goto et al. | |
| 2003/0047076 A1 | 3/2003 | Liu | |
| 2003/0080345 A1 | 5/2003 | Motoki et al. | |
| 2003/0164507 A1 | 9/2003 | Edmond et al. | |
| 2004/0070004 A1 | 4/2004 | Eliashevich et al. | |
| 2004/0080256 A1 | 4/2004 | Hampden-Smith et al. | |
| 2004/0104391 A1 | 6/2004 | Maeda et al. | |
| 2004/0116033 A1 | 6/2004 | Ouderkirk et al. | |
| 2004/0124435 A1 | 7/2004 | D'Evelyn et al. | |
| 2004/0161222 A1 | 8/2004 | Niida et al. | |
| 2004/0190304 A1 | 9/2004 | Sugimoto et al. | |
| 2004/0201598 A1 | 10/2004 | Eliav et al. | |
| 2004/0207998 A1 | 10/2004 | Suehiro et al. | |
| 2004/0227149 A1 | 11/2004 | Ibbetson et al. | |
| 2004/0245543 A1 | 12/2004 | Yoo | |
| 2004/0251471 A1 | 12/2004 | Dwilinski et al. | |
| 2005/0001227 A1 | 1/2005 | Niki et al. | |
| 2005/0045894 A1 | 3/2005 | Okuyama et al. | |
| 2005/0084218 A1 | 4/2005 | Ide et al. | |
| 2005/0087753 A1 | 4/2005 | D'Evelyn et al. | |
| 2005/0121679 A1 | 6/2005 | Nagahama et al. | |
| 2005/0167680 A1 | 8/2005 | Shei et al. | |
| 2005/0179376 A1 | 8/2005 | Fung et al. | |
| 2005/0199899 A1 | 9/2005 | Lin et al. | |
| 2005/0214992 A1 | 9/2005 | Chakraborty et al. | |
| 2005/0224830 A1 | 10/2005 | Blonder et al. | |
| 2005/0263791 A1 | 12/2005 | Yanagihara et al. | |
| 2006/0006404 A1 | 1/2006 | Ibbetson et al. | |
| 2006/0038542 A1 | 2/2006 | Park et al. | |
| 2006/0060131 A1 | 3/2006 | Atanackovic | |
| 2006/0060872 A1 | 3/2006 | Edmond et al. | |
| 2006/0068154 A1 | 3/2006 | Parce et al. | |
| 2006/0079082 A1 | 4/2006 | Bruhns et al. | |
| 2006/0097385 A1 | 5/2006 | Negley | |
| 2006/0118799 A1 | 6/2006 | D'Evelyn et al. | |
| 2006/0124051 A1 | 6/2006 | Yoshioka et al. | |
| 2006/0163589 A1 | 7/2006 | Fan et al. | |
| 2006/0166390 A1 | 7/2006 | Letertre et al. | |
| 2006/0169993 A1 | 8/2006 | Fan et al. | |
| 2006/0177362 A1 | 8/2006 | D'Evelyn et al. | |
| 2006/0180828 A1 | 8/2006 | Kim et al. | |
| 2006/0186418 A1 | 8/2006 | Edmond et al. | |
| 2006/0189098 A1 | 8/2006 | Edmond | |
| 2006/0204865 A1 | 9/2006 | Erchak et al. | |
| 2006/0208262 A1 | 9/2006 | Sakuma et al. | |
| 2006/0214287 A1 | 9/2006 | Ogihara et al. | |
| 2006/0255343 A1 | 11/2006 | Ogihara et al. | |
| 2006/0261364 A1 | 11/2006 | Suehiro et al. | |
| 2006/0273339 A1 | 12/2006 | Steigerwald et al. | |
| 2006/0288927 A1 | 12/2006 | Chodelka et al. | |
| 2007/0045200 A1 | 3/2007 | Moon et al. | |
| 2007/0093073 A1 | 4/2007 | Farrell, Jr. et al. | |
| 2007/0096239 A1 | 5/2007 | Cao et al. | |
| 2007/0105351 A1 | 5/2007 | Motoki et al. | |
| 2007/0114563 A1 | 5/2007 | Paek et al. | |
| 2007/0114569 A1 | 5/2007 | Wu et al. | |
| 2007/0121690 A1 * | 5/2007 | Fujii et al. | 372/43.01 |
| 2007/0126023 A1 | 6/2007 | Haskell et al. | |
| 2007/0131967 A1 | 6/2007 | Kawaguchi et al. | |
| 2007/0170450 A1 | 7/2007 | Murphy | |
| 2007/0181895 A1 | 8/2007 | Nagai | |
| 2007/0202624 A1 | 8/2007 | Yoon et al. | |
| 2007/0231963 A1 | 10/2007 | Doan et al. | |

(56) References Cited

U.S. PATENT DOCUMENTS

| | | |
|---|---|---|
| 2007/0231978 A1 | 10/2007 | Kanamoto et al. |
| 2007/0264733 A1 | 11/2007 | Choi et al. |
| 2007/0280320 A1 | 12/2007 | Feezell et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0121913 A1 | 5/2008 | McKenzie et al. |
| 2008/0128752 A1 | 6/2008 | Wu |
| 2008/0142781 A1 | 6/2008 | Lee |
| 2008/0151543 A1 | 6/2008 | Wang |
| 2008/0164489 A1 | 7/2008 | Schmidt et al. |
| 2008/0164578 A1 | 7/2008 | Tanikella et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0192791 A1 | 8/2008 | Furukawa et al. |
| 2008/0194054 A1 | 8/2008 | Lin et al. |
| 2008/0206925 A1 | 8/2008 | Chatterjee et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0261381 A1 | 10/2008 | Akiyama et al. |
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0303033 A1 | 12/2008 | Brandes |
| 2009/0065798 A1 | 3/2009 | Masui et al. |
| 2009/0072252 A1 | 3/2009 | Son et al. |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0140279 A1 | 6/2009 | Zimmerman et al. |
| 2009/0146170 A1 | 6/2009 | Zhong et al. |
| 2009/0155989 A1 | 6/2009 | Uematsu et al. |
| 2009/0173958 A1 | 7/2009 | Chakraborty et al. |
| 2009/0194796 A1 | 8/2009 | Hashimoto et al. |
| 2009/0206354 A1 | 8/2009 | Kitano et al. |
| 2009/0227056 A1 | 9/2009 | Kyono et al. |
| 2009/0250686 A1 | 10/2009 | Sato et al. |
| 2009/0267098 A1 | 10/2009 | Choi |
| 2009/0273005 A1 | 11/2009 | Lin |
| 2009/0309110 A1 | 12/2009 | Raring et al. |
| 2009/0315480 A1 | 12/2009 | Yan et al. |
| 2009/0321745 A1 | 12/2009 | Kinoshita et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0006876 A1* | 1/2010 | Moteki et al. ............... 257/95 |
| 2010/0025656 A1 | 2/2010 | Raring et al. |
| 2010/0032691 A1 | 2/2010 | Kim |
| 2010/0055819 A1 | 3/2010 | Ohba et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0148145 A1 | 6/2010 | Ishibashi et al. |
| 2010/0148210 A1 | 6/2010 | Huang et al. |
| 2010/0149814 A1 | 6/2010 | Zhai et al. |
| 2010/0155746 A1 | 6/2010 | Ibbetson et al. |
| 2010/0164403 A1 | 7/2010 | Liu |
| 2010/0195687 A1 | 8/2010 | Okamoto et al. |
| 2010/0200837 A1 | 8/2010 | Zimmerman et al. |
| 2010/0200888 A1 | 8/2010 | Kuhmann et al. |
| 2010/0220262 A1 | 9/2010 | DeMille et al. |
| 2010/0240158 A1 | 9/2010 | Ter-Hovhannissian |
| 2010/0244055 A1 | 9/2010 | Greisen |
| 2010/0258830 A1 | 10/2010 | Ide et al. |
| 2010/0290208 A1 | 11/2010 | Pickard |
| 2010/0295088 A1 | 11/2010 | D'Evelyn et al. |
| 2010/0309943 A1 | 12/2010 | Chakraborty et al. |
| 2011/0017298 A1 | 1/2011 | Lee |
| 2011/0038154 A1 | 2/2011 | Chakravarty et al. |
| 2011/0056429 A1 | 3/2011 | Raring et al. |
| 2011/0057205 A1 | 3/2011 | Mueller et al. |
| 2011/0068700 A1 | 3/2011 | Fan |
| 2011/0075694 A1 | 3/2011 | Yoshizumi et al. |
| 2011/0101350 A1 | 5/2011 | Greisen |
| 2011/0101400 A1 | 5/2011 | Chu et al. |
| 2011/0101414 A1 | 5/2011 | Thompson et al. |
| 2011/0108081 A1 | 5/2011 | Werthen et al. |
| 2011/0124139 A1 | 5/2011 | Chang |
| 2011/0175200 A1 | 7/2011 | Yoshida |
| 2011/0177631 A1 | 7/2011 | Gardner et al. |
| 2011/0180781 A1 | 7/2011 | Raring et al. |
| 2011/0182056 A1 | 7/2011 | Trottier et al. |
| 2011/0186860 A1* | 8/2011 | Enya et al. ............... 257/76 |
| 2011/0186874 A1 | 8/2011 | Shum |
| 2011/0204324 A1* | 8/2011 | Kim ............... 257/13 |
| 2011/0216795 A1 | 9/2011 | Hsu et al. |
| 2011/0266552 A1 | 11/2011 | Tu et al. |
| 2011/0279998 A1 | 11/2011 | Su et al. |
| 2011/0317397 A1 | 12/2011 | Trottier et al. |
| 2012/0007102 A1 | 1/2012 | Feezell et al. |
| 2012/0104412 A1 | 5/2012 | Zhong et al. |
| 2012/0135553 A1 | 5/2012 | Felker et al. |
| 2012/0187412 A1 | 7/2012 | D'Evelyn et al. |
| 2012/0199841 A1 | 8/2012 | Batres et al. |
| 2012/0235201 A1 | 9/2012 | Shum |
| 2012/0288974 A1 | 11/2012 | Sharma et al. |
| 2012/0299492 A1 | 11/2012 | Egawa et al. |
| 2012/0313541 A1 | 12/2012 | Egawa et al. |
| 2013/0022758 A1 | 1/2013 | Trottier |
| 2013/0026483 A1 | 1/2013 | Sharma et al. |
| 2013/0043799 A1 | 2/2013 | Siu et al. |
| 2013/0044782 A1 | 2/2013 | Raring |
| 2013/0112987 A1 | 5/2013 | Fu et al. |
| 2013/0126902 A1 | 5/2013 | Isozaki et al. |
| 2013/0234108 A1 | 9/2013 | David et al. |
| 2013/0313516 A1 | 11/2013 | David et al. |
| 2013/0322089 A1 | 12/2013 | Martis et al. |
| 2014/0103356 A1 | 4/2014 | Krames et al. |
| 2014/0145235 A1 | 5/2014 | Shum |
| 2014/0312373 A1* | 10/2014 | Donofrio ............... 257/98 |

FOREIGN PATENT DOCUMENTS

| | | |
|---|---|---|
| JP | 09-082587 | 3/1997 |
| JP | 11-340507 | 12/1999 |
| JP | 11-340576 | 12/1999 |
| JP | 2001-177146 | 6/2001 |
| JP | 2003-031844 | 1/2003 |
| JP | 2006-147933 | 6/2006 |
| JP | 2007-110090 | 4/2007 |
| JP | 2008-084973 | 4/2008 |
| JP | 2008-172040 | 7/2008 |
| WO | WO 2006/062880 | 6/2006 |
| WO | WO 2009/001039 | 12/2008 |
| WO | WO 2009/066430 | 5/2009 |
| WO | WO 2010/150880 | 12/2010 |
| WO | WO 2011/010774 | 1/2011 |
| WO | WO 2013171286 | * 11/2013 |

OTHER PUBLICATIONS

USPTO Office Action for U.S. Appl. No. 12/861,765 dated Mar. 28, 2014 (12 pages).

USPTO Notice of Allowance for U.S. Appl. No. 13/012,674 dated Apr. 30, 2014 (8 pages).

USPTO Office Action for U.S. Appl. No. 13/019,897 dated Jun. 12, 2014 (8 pages).

USPTO Office Action for U.S. Appl. No. 13/304,182 dated May 9, 2014 (12 pages).

USPTO Office Action for U.S. Appl. No. 13/357,578 dated May 13, 2014 (8 pages).

(56) References Cited

OTHER PUBLICATIONS

USPTO Office Action for U.S. Appl. No. 13/629,366 dated Apr. 18, 2014 (7 pages).
USPTO Office Action for U.S. Appl. No. 13/904,237 dated May 22, 2014 (13 pages).
USPTO Office Action for U.S. Appl. No. 14/171,885 dated Mar. 28, 2014 (8 pages).
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
Cich et al., 'Bulk GaN based violet light-emitting diodes with high efficiency at very high current density', Applied Physics Letters, Nov. 29, 2012, pp. 223509-1-223509-3.
Csuti et al., 'Color-matching experiments with RGB-LEDs', Color Research and Application, vol. 33, No. 2, 2008, pp. 1-9.
Davis et al., 'Color quality scale', Optical Engineering, vol. 49, No. 3, Mar. 2010, pp. 033602-1-036602-16.
Hanifin et al., 'Photoreception for Circadian, Neuroendocrine, and Neurobehavioral Regulation', Journal of Physiological Anthropology, vol. 26, 2007, pp. 87-94.
Houser et al., 'Review of measures for light-source color rendition and considerations for a two-measure system for characterizing color rendition', Optics Express, vol. 21, No. 8, Apr. 19, 2013, pp. 10393-10411.
Iso et al., 'High Brightness Blue InGaN/GaN Light Emitting Diode on Nonpolar m-Plane Bulk GaN Substrate', Japanese Journal of Applied Physics, 2007, vol. 46, No. 40, pp. L960-L962.
Paper and Board Determination of CIE Whiteness, D65/10 (outdoor daylight), ISO International Standard 11475:2004E (2004), 18 pgs.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.
International Search Report & Written Opinion of PCT Application No. PCT/US2013/029453, dated Jul. 25, 2013, 11 pages total.
http://www.philipslumileds.com/products/luxeon-flash, 'LUXEON Flash', Philips Lumileds, Aug. 8, 2013, pp. 1-2.
Rea et al., 'White Lighting', COLOR Research and Application, vol. 38, No. 2, Sep. 3, 2011, pp. 82-92.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Communication from the Korean Patent Office re 10-2012-7009980 dated Apr. 15, 2013, 6 pages.
Whitehead et al., 'A Monte Carlo method for assessing color rendering quality with possible application to color rendering standards', Color Research and Application, vol. 37, No. 1, Feb. 2012, pp. 13-22.
USPTO Office Action for U.S. Appl. No. 12/481,543 dated Jun. 27, 201110 pages.
USPTO Office Action for U.S. Appl. No. 12/491,176 dated Mar. 1, 2012, 10 pages.
USPTO Office Action for U.S. Appl. No. 12/491,176 dated Jul. 19, 2012, 13 pages.
USPTO Office Action for U.S. Appl. No. 12/569,841 dated Dec. 23, 2011, 13 pages.
USPTO Office Action for U.S. Appl. No. 12/569,841 dated Mar. 26, 2013, 18 pages.
USPTO Office Action for U.S. Appl. No. 12/569,841 dated Aug. 13, 2013, 21 pages.
USPTO Office Action for U.S. Appl. No. 12/569,844 dated Oct. 12, 2012, 12 pages.
USPTO Notice of Allowance for U.S. Appl. No. 12/569,844 dated Mar. 7, 2013, 9 pages.
USPTO Notice of Allowance for U.S. Appl. No. 12/720,593 dated Jul. 11, 2012, 7 pages.
USPTO Office Action for U.S. Appl. No. 12/749,466 dated Jul. 3, 2012, 18 pages.
USPTO Office Action for U.S. Appl. No. 12/749,476 dated Apr. 11, 2011, 15 pages.
USPTO Office Action for U.S. Appl. No. 12/749,476 dated Nov. 8, 2011, 11 pages.
USPTO Notice of Allowance for U.S. Appl. No. 12/749,476 dated May 4, 2012, 8 pages.
USPTO Notice of Allowance for U.S. Appl. No. 12/749,476 dated Jun. 26, 2012, 8 pages.
USPTO Office Action for U.S. Appl. No. 12/861,765 dated Jul. 2, 2012, 12 pages.
USPTO Office Action for U.S. Appl. No. 12/861,765 dated Mar. 7, 2013, 13 pages.
USPTO Office Action for U.S. Appl. No. 12/861,765 dated Sep. 17, 2013, 10 pages.
USPTO Office Action for U.S. Appl. No. 12/879,784 dated Jan. 25, 2012, 7 pages.
USPTO Notice of Allowance for U.S. Appl. No. 12/879,784 dated Apr. 3, 2012, 7 pages.
USPTO Office Action for U.S. Appl. No. 12/914,789 dated Oct. 12, 2011, 8 pagse.
USPTO Office Action for U.S. Appl. No. 12/914,789 dated Feb. 24, 2012, 9 pages.
USPTO Notice of Allowance for U.S. Appl. No. 12/914,789 dated May 17, 2012, 5 pages.
USPTO Office Action for U.S. Appl. No. 12/936,238 dated Aug. 30, 2012, 12 pages.
USPTO Office Action for U.S. Appl. No. 12/936,238 dated Jan. 30, 2013, 12 pages.
USPTO Notice of Allowance for U.S. Appl. No. 12/936,238 dated Apr. 16, 2013, 10 pages.
USPTO Office Action for U.S. Appl. No. 13/014,622 dated Nov. 28, 2011, 14 pages.
USPTO Office Action for U.S. Appl. No. 13/014,622 dated Apr. 30, 2012, 14 pages.
USPTO Office Action for U.S. Appl. No. 13/019,897 dated Mar. 30, 2012, 15 pages.
USPTO Office Action for U.S. Appl. No. 13/019,897 dated Jan. 16, 2013, 7 pages.
USPTO Office Action for U.S. Appl. No. 13/025,833 dated Jul. 12, 2012, 16 pages.
USPTO Notice of Allowance for U.S. Appl. No. 13/163,482 dated Jul. 31, 2012, 5 pages.
USPTO Office Action for U.S. Appl. No. 13/179,346 dated Aug. 17, 2012, 21 pages.
USPTO Office Action for U.S. Appl. No. 13/179,346 dated Dec. 13, 2012, 24 pages.
USPTO Office Action for U.S. Appl. No. 13/210,769 dated Apr. 4, 2013, 14 pages.
USPTO Office Action for U.S. Appl. No. 13/281,221 dated Jun. 21, 2013, 6 pages.
USPTO Notice of Allowance for U.S. Appl. No. 13/298,905 dated Jun. 11, 2013, 9 pages.
USPTO Office Action for U.S. Appl. No. 13/328,978 dated May 15, 2013, 25 pages.
USPTO Office Action for U.S. Appl. No. 13/465,976 dated Aug. 16, 2012, 17 pages.
USPTO Office Action for U.S. Appl. No. 13/465,976 dated Dec. 20, 2012, 17 pages.
USPTO Office Action for U.S. Appl. No. 13/482,956 dated Aug. 17, 2012, 10 pages.
USPTO Office Action for U.S. Appl. No. 13/482,956 dated Feb. 14, 2013, 16 pages.
USPTO Office Action for U.S. Appl. No. 13/482,956 dated Jul. 22, 2013, 17 pages.
USPTO Office Action for U.S. Appl. No. 13/600,988 dated Jul. 18, 2013, 13 pages.
USPTO Notice of Allowance for U.S. Appl. No. 13/600,988 dated Sep. 16, 2013, 9 pages.
Motoki et al., 'Dislocation reduction in GaN crystal by advanced-DEEP', Journal of Crystal Growth, vol. 305, Apr. 1, 2007, pp. 377-383.
Communication from the Japanese Patent Office re 2013515583 dated Feb. 27, 2014, 2 pages.
USPTO Office Action for U.S. Appl. No. 12/569,841 dated Feb. 14, 2014, 20 pages.

(56) References Cited

OTHER PUBLICATIONS

USPTO Office Action for U.S. Appl. No. 13/012,674 dated Jan. 17, 2014, 15 pages.
USPTO Office Action for U.S. Appl. No. 13/781,633 dated Mar. 6, 2014, 12 pages.
Aguilar, 'Ohmic n-contacts to Gallium Nitride Light Emitting Diodes', National Nanotechnologhy Infrastructure Network, 2007, p. 56-81.
Baker et al., 'Characterization of Planar Semipolar Gallium Nitride Films on Spinel Substrates', Japanese Journal of Applied Physics, vol. 44, No. 29, 2005, pp. L920-L922.
Founta et al., 'Anisotropic Morphology of Nonpolar a-Plane GaN Quantum Dots and Quantum Wells', Journal of Applied Physics, vol. 102, vol. 7, 2007, pp. 074304-1-074304-6.
Haskell et al., 'Defect Reduction in (1100) m-plane gallium nitride via lateral epitaxial overgrowth by hydride vapor phase epitaxy', Applied Physics Letters 86, 111917 (2005), pp. 1-3.
Lu et al., 'Etch-Pits of GaN Films with Different Etching Methods', Journal of the Korean Physical Society, vol. 45, Dec. 2004, p. S673-S675.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Sato et al., 'High Power and High Efficiency Semipolar InGaN Light Emitting Diodes', Journal of Light and Visible Environment, vol. 32, No. 2, Dec. 13, 2007, pp. 57-60.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
Communication from the Japanese Patent Office re 2012-529969, dated Oct. 15, 2013, (6 pages).
Weaver et al., 'Optical Properties of Selected Elements', Handbook of Chemistry and Physics, 94th Edition, 2013-2014, pp. 12-126-12-150.
USPTO Office Action for U.S. Appl. No. 12/491,169 dated Oct. 22, 2010 (9 pages).
USPTO Office Action for U.S. Appl. No. 12/491,169 dated May 11, 2011 (9 pages).
USPTO Office Action for U.S. Appl. No. 12/491,176 dated Nov. 22, 2013 (14 pages).
USPTO Office Action for U.S. Appl. No. 12/497,289 dated Feb. 2, 2012 (6 pages).
USPTO Notice of Allowance for U.S. Appl. No. 12/497,289 dated May 22, 2012 (7 pages).
USPTO Office Action for U.S. Appl. No. 12/785,953 dated Apr. 12, 2012 (11 pages).
USPTO Office Action for U.S. Appl. No. 12/785,953 dated Jan. 11, 2013 (14 pages).
USPTO Office Action for U.S. Appl. No. 12/785,953 dated Oct. 3, 2013 (10 pages).
USPTO Office Action for U.S. Appl. No. 12/880,803 dated Feb. 22, 2012 (8 pages).
USPTO Notice of Allowance for U.S. Appl. No. 12/880,803 dated Jul. 18, 2012 (5 pages).
USPTO Office Action for U.S. Appl. No. 12/995,946 dated Mar. 28, 2012 (17 pages).
USPTO Office Action for U.S. Appl. No. 12/995,946 dated Jan. 29, 2013 (25 pages).
USPTO Office Action for U.S. Appl. No. 12/995,946 dated Aug. 2, 2013 (15 pages).
USPTO Office Action for U.S. Appl. No. 13/019,897 dated Dec. 2, 2013 (17 pages).
USPTO Office Action for U.S. Appl. No. 13/135,087 dated Sep. 27, 2013 (7 pages).
USPTO Office Action for U.S. Appl. No. 13/210,769 dated Oct. 28, 2013 (9 pages).
USPTO Notice of Allowance for U.S. Appl. No. 13/281,221 dated Nov. 12, 2013 (10 pages).
USPTO Office Action for U.S. Appl. No. 13/328,978 dated Sep. 26, 2013 (25 pages).
USPTO Office Action for U.S. Appl. No. 13/357,315 dated Oct. 15, 2013 (12 pages).
USPTO Notice of Allowance for U.S. Appl. No. 13/482,956 dated Oct. 28, 2013 (9 pages).
USPTO Office Action for U.S. Appl. No. 13/548,635 dated Jun. 14, 2013 (5 pages).
USPTO Notice of Allowance for U.S. Appl. No. 13/548,635 dated Sep. 16, 2013 (6 pages).
USPTO Office Action for U.S. Appl. No. 13/548,770 dated Mar. 12, 2013 (5 pages).
USPTO Notice of Allowance for U.S. Appl. No. 13/548,770 dated Jun. 25, 2013 (6 pages).
USPTO Office Action for U.S. Appl. No. 13/629,366 dated Oct. 31, 2013 (7 pages).
USPTO Office Action for U.S. Appl. No. 13/723,968 dated Nov. 29, 2013 (23 pages).

\* cited by examiner

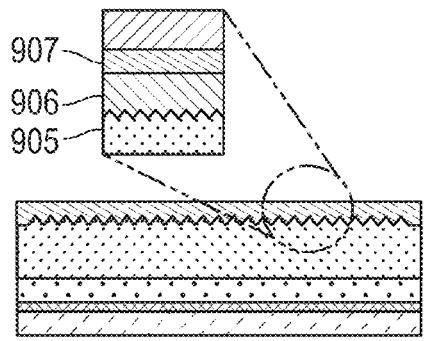
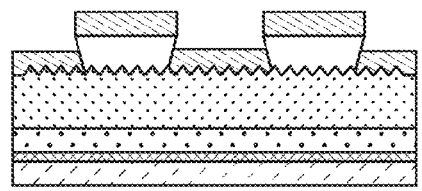
FIG. 9A  FIG. 9B
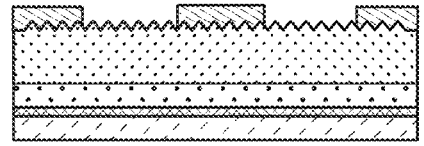
FIG. 10
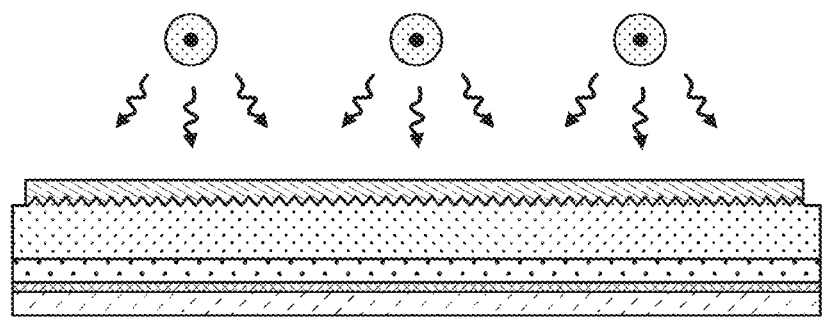
FIG. 11

US 8,994,033 B2

CONTACTS FOR AN N-TYPE GALLIUM AND NITROGEN SUBSTRATE FOR OPTICAL DEVICES

BACKGROUND

A metric for the efficiency of light emitting diodes (LEDs) is the luminance per watt. The luminance provided by light emitting diodes depends on several factors such as internal quantum efficiency, which quantifies the fraction of injected carriers converted to photons, and extraction efficiency, which quantifies the fraction of photons successfully extracted from the light emitting diode. Internal absorption may prevent photons from escaping the light emitting diode. To realize high efficiency LEDs, both the internal efficiency and extraction efficiency should be optimized. The potential gains from improving extraction efficiency, however, are likely to be greater and simpler to accomplish than are gains from improving internal efficiency.

From the above, it can be appreciated that improved techniques for manufacturing optical devices are highly desired.

SUMMARY

The present invention relates to techniques for manufacturing optical devices. More particularly, the present invention is directed to light emitting diodes and in particular to ohmic contacts for light emitting diodes.

In an example, the present invention provides a method for fabricating LED devices. The method includes providing a gallium and nitrogen containing substrate member (e.g., GaN) comprising a backside surface and a front side surface. The front side surface includes an n-type material overlying the substrate member, an active region overlying the n-type material, and a p-type material overlying the active region. The method includes subjecting the backside surface to a polishing process, causing a backside surface characterized by a surface roughness. The method also includes subjecting the backside surface to an anisotropic etching process exposing various crystal planes to form a plurality of pyramid-like structures distributed spatially in a non-periodic manner on the backside surface. The method includes treating the backside surface, comprised of a plurality of pyramid-like structures, to a plasma species, and subjecting the backside surface to a surface treatment. The method forms a contact material comprising an aluminum bearing species or a titanium bearing species overlying the surface-treated backside to form a plurality of LED devices with the contact material.

In an example, the present invention provides an optical device, e.g., a LED device. The device has a gallium and nitrogen containing substrate member comprising a backside surface and a front side surface, which includes an n-type material overlying the substrate member, an active region overlying the n-type material, and a p-type material overlying the active region. The device has a plurality of pyramid-like structures distributed spatially in a non-periodic manner on the backside surface and a contact material comprising an aluminum bearing species or a titanium bearing species overlying the surface-treated backside to form a plurality of LED devices with the contact material.

In an example, the backside surface is characterized by a nitrogen face of a c-plane and an n-type GaN with carrier concentration ranging from $1E15/cm^3$ to $1E20/cm^3$. In an example, the surface roughness ranges from about 0.3 nm to 200 nm. In an example, each of the plurality of pyramid-like structures has a height from about 20 nm to 1000 nm. In an example, the active region is configured to emit electromagnetic radiation in a range of 450 nm to 480 nm. In an example, the active region comprises a plurality of quantum well structures. In an example, each of the pyramid-like structures comprises three sides or two or more sides.

Various additional objects, features, and advantages of the present invention can be more fully appreciated with reference to the detailed description and accompanying drawings that follow.

BRIEF DESCRIPTION OF THE DRAWINGS

FIGS. 9A and 9B are illustrations of metal layers deposited on the n-GaN surface (the stack begins with a first layer of Al or Ti, followed by a barrier layer) according to embodiments of the present invention.

FIG. 10 illustrates a device structure after photoresist and unwanted metal are removed in a liftoff process according to embodiments of the present invention.

FIG. 11 illustrates a metal annealing process to reduce the contact resistance according to embodiments of the present invention.

DETAILED DESCRIPTION

Figure 1:
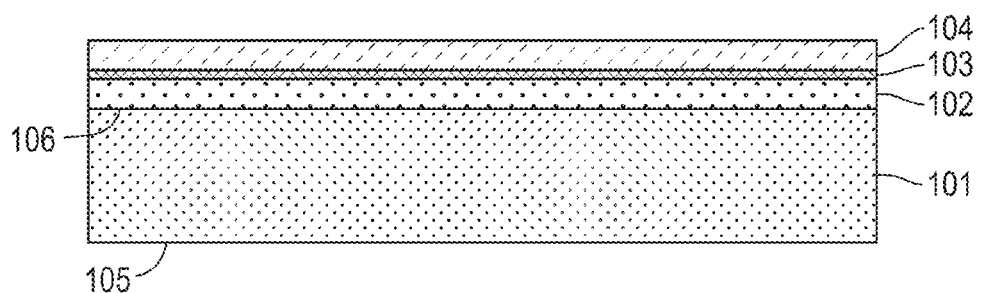
FIG. 1 is a simplified diagram of an n-type c-plane GaN substrate with an epitaxial LED structure (n-layer, active region, p-layer) according to embodiments of the present invention.

The present invention relates to techniques for manufacturing optical devices. More particularly, the present invention includes light emitting diodes and in particular, ohmic contacts for light emitting diodes. Such light emitting devices can include LEDs, lasers and the like.

As background, we have observed that conventional GaN-based light emitting diodes (LED) emitting in the ultraviolet and visible regions are based on heteroepitaxial growth where growth is initiated on a substrate other than GaN such as sapphire, silicon carbide, or silicon. This is due to the limited supply and high cost of free-standing GaN substrates, which has prevented their viability for use in high volume LED manufacture. However, the field of bulk-GaN technology has seen rapid gains over the past couple of years providing promise for large-scale deployment into LED manufacture. Such a technology shift will provide huge benefits to LED performance and manufacturing.

Light extraction of LEDs emitting in the visible portion of the spectrum, such as gallium nitride (GaN) LEDs, can be improved with high reflectivity metallurgies, which are typically mounted to one side of the LED. A desirable electrical contact to a GaN-based device has a reduced impact on the operating voltage of the device. This can be accomplished with the use of ohmic contacts. Thus, a desirable metal contact to an LED is both ohmic and highly reflective. A common approach for making contacts to p-GaN is to use a silver-containing layer. Silver is desirable because of its high reflectance across a large portion of the visible spectrum. Though highly reflective, silver does not make good electrical contacts to n-GaN. The carrier energies in n-GaN dictates that a metal with a different work function be used to provide ohmic contacts. However, metal reflectivity and work function are not the sole concerns of ohmic contact formation. The processing method should also address surface contamination, and in the case of GaN, relative amounts of exposed Ga and N atoms at the surface. Therefore, making metal contacts to GaN LEDs is a complex endeavor that should take into consideration optical and electrical metal properties, semiconductor crystal properties and surface chemistry.

Progress has been made during the past decade and a half in the performance of gallium nitride (GaN) based light emitting diodes (LEDs). Devices with a luminous efficiency greater than 100 lumens per watt have been demonstrated in the laboratory, and commercial devices have an efficiency that is already considerably superior to that of incandescent lamps and is competitive with fluorescent lamps. Further improvements in efficiency can reduce operating costs, reduce electricity consumption, and decrease emissions of carbon dioxide and other greenhouse gases produced in generating the energy used for lighting applications.

In an embodiment, a method of producing an ohmic contact to n-type GaN is provided. This method involves three steps, starting with a polished GaN surface: an alkaline treatment, a plasma treatment, and an acid treatment. The alkaline treatment can be central to the success of the method because it produces fine scale roughness that exposes alternate crystal facets, which may be more favorable to ohmic contact formation. The plasma treatment and acid treatment are more in line with conventional surface cleaning methods before metal deposition.

Ohmic contacts are desirable for manufacturing LEDs with high electrical efficiency. There have been attempts to manufacture contacts to LEDs using different metallization pre-treatments, metal thin film stacks, and annealing treatments to obtain ohmic contacts to n-type and p-type GaN. For LEDs, it is also desirable to have an ohmic contact metal with high reflectivity. In addition, lower annealing temperatures are generally favored.

For example, a present method for fabricating a device with an ohmic n-contact includes laser scribing Ti/Au contacts. This method forms (e.g., cuts, etches, patterns, drills, machines) trenches into the n-contacts approximately 10 microns to 30 microns deep. The laser scribe effectively anneals the n-contact metal at a very high temperature and mixes it into the GaN. However, the trenches become filled with a high optical loss metal alloy, and the surface of the contacts become covered with burned metal which makes it difficult to test the contacts and impacts wire-bond yield and reliability due to gradual intermetallic reactions. This disclosure describes a method for achieving low contact resistance to n-type GaN using a chemical solution that produces a small-scale (height<0.1 micron; pitch<2 microns) roughness on the GaN surface. Further details of the present invention can be found throughout the present specification and more particularly below.

FIG. 1 is a simplified diagram of an n-type c-plane GaN substrate 101 with epitaxial LED structure (n-layer 102, active region 103, p-layer 104) according to embodiments of the present invention. As shown, the method begins with a gallium and nitrogen containing substrate member. The substrate includes a backside surface 105 and a front side surface 106. The front side surface includes an n-type material overlying the substrate member, an active region overlying the n-type material, and a p-type material overlying the active region. Preferably, the active region has one or more quantum wells that emit light at visible or ultraviolet wavelengths.

Figure 2:
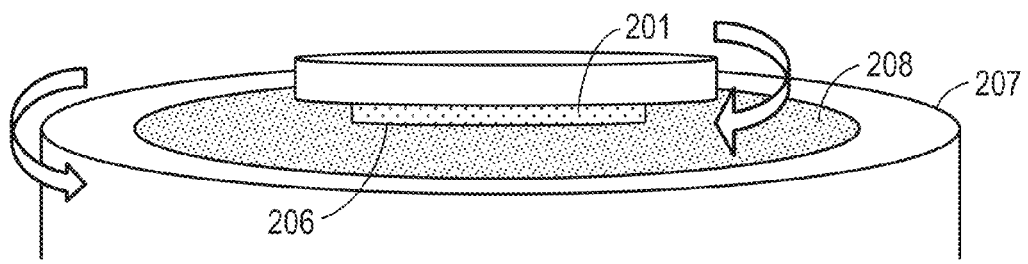
FIG. 2 illustrates polishing of the n-type c-plane GaN substrate with a diamond slurry to form an optically smooth (RMS surface roughness 100 nm or less) backside surface according to embodiments of the present invention.

FIG. 2 illustrates polishing of n-type substrate 201 with diamond slurry until optically smooth (RMS surface roughness 100 nm or less) according to embodiments of the present invention. As shown, the method includes subjecting the backside surface 206 to polishing process to cause the backside surface characterized by a surface roughness of 100 nanometers RMS. Wafers are mounted on a rotating plate 207, which sits on a large polyurethane impregnated polyester felt polishing pad 208. The polishing pad is rotated at rate ranging from about 5 rpm to 200 rpm or about 60 rpm and others, while the plate with the wafers rotates at about 1 rpm to 25 rpm and in certain embodiments about 10 rpm. A slurry mixture is a suspension of suitably-sized abrasive particles ranging in size from about 0.05 μm to 5 μm, and in certain embodiments 1 μm diamond particles or other abrasive species such as other metals, semiconductors, conductors and their combinations e.g., SiC, diamond, $Al_2O_3$, or GaN. The slurry mixture also includes a neutral solvent such as water and/or alcohol and can also be acidic or basic. The slurry mixture is dispensed onto the polishing pad during the method.

Figure 3:
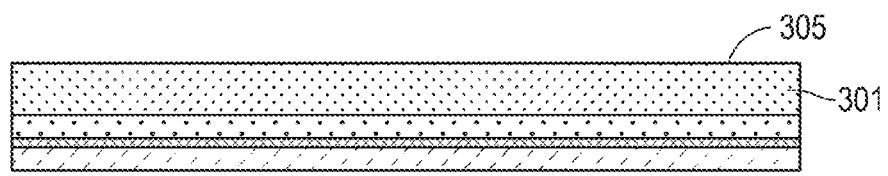
FIG. 3 shows a substrate with an optically smooth nitrogen face of c-plane GaN, prepared by polishing or by lapping and polishing according to embodiments of the present invention.

FIG. 3 shows a substrate 301 with an optically smooth nitrogen face of c-plane GaN surface, prepared by polishing or by lapping and polishing according to embodiments of the present invention. As shown, the optically smooth nitrogen face is characterized by a surface roughness of between 200 nm RMS and 0.3 nm RMS. As used herein, the term nitrogen face means an outermost and/or surface region and/or layer of atoms comprising substantially of nitrogen atoms, although there may be some variations, or other meanings consistent with the understanding of one of ordinary skill of the art. As an example, a nitrogen face can include an exposed c-plane.

Figure 4:
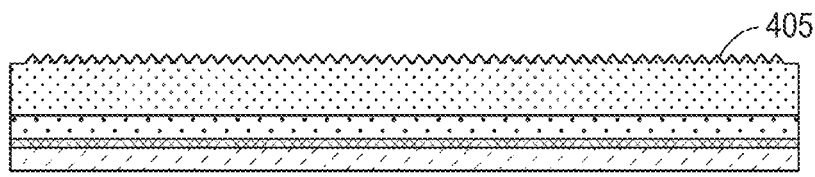
FIG. 4 shows an n-GaN surface roughened by exposure to a solution of silicic acid hydrate, potassium hydroxide, and water according to embodiments of the present invention.

FIG. 4 shows an n-GaN surface 405 roughened by exposure to a solution of silicic acid hydrate, potassium hydroxide (KOH), and water according to embodiments of the present invention. The solution of silicic acid hydrate, KOH, and water are mixed in the proportion of about 60 g silicic acid hydrate per liter of 9% KOH solution. The height and pitch of the roughness can be controlled by the silicic acid and KOH concentrations. The temperature of the etchant is held at 60° C. The etchant can be continuously agitated to provide uniformity of roughness. Although the method used a selected chemistry and conditions for the etchant, there can be variations. For example, the acid can also be boric acid, chlorosulfonic acid, sulfamic acid, or others. As shown, the method subjects the backside surface to crystal plane dependent etching process to form a plurality of pyramid-like structures formed spatially in an even manner on the backside surface, as further shown by the Figure below. Each of the pyramid-like structures generally includes at least 6 sides configured and extending from an apex to a base region. The pyramid-like structures are configured such that each of the base regions substantially cover a plane in a manner where the base regions are coupled to each other without exposing the plane. At least 80% of the pyramid-like structures have a base region having a normalized size ranging from 0.3 to 3 relative to the median base size. In one example, the median base size is 0.5 µm. The plurality of the pyramid-like structures can form a non-periodic spatial pattern, although there may be variations. In an example, the distance between the base and the apex is twice the length of the base.

Figure 5:
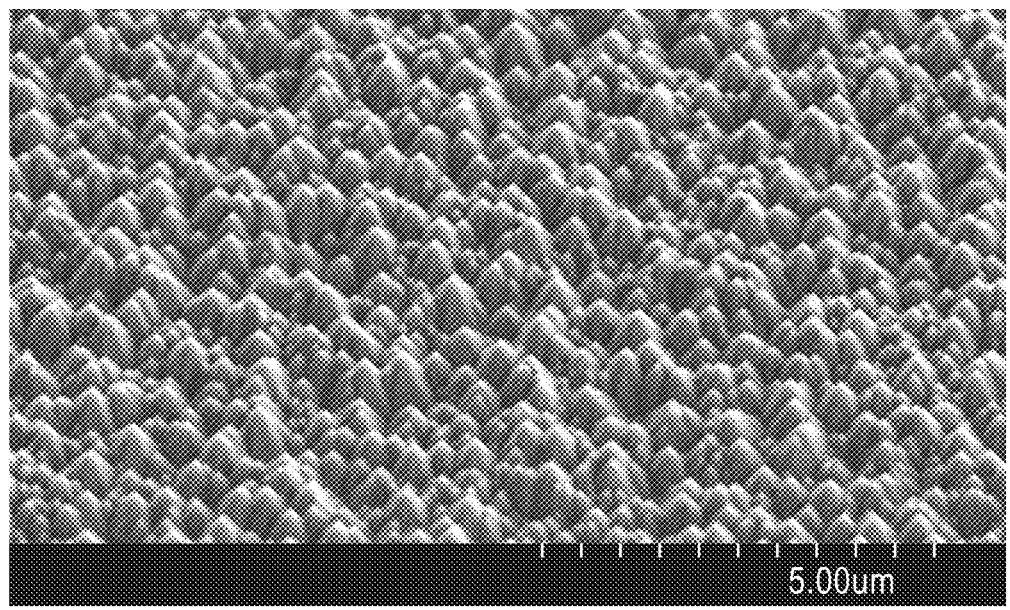
FIG. 5 shows a scanning electron microscope image of a roughened n-GaN surface after exposure to a solution of silicic acid hydrate, potassium hydroxide, and water according to embodiments of the present invention.

FIG. 5 shows a scanning electron microscope image of a roughened n-GaN surface after exposure to a solution of silicic acid hydrate, KOH, and water according to embodiments of the present invention.

Figure 6:
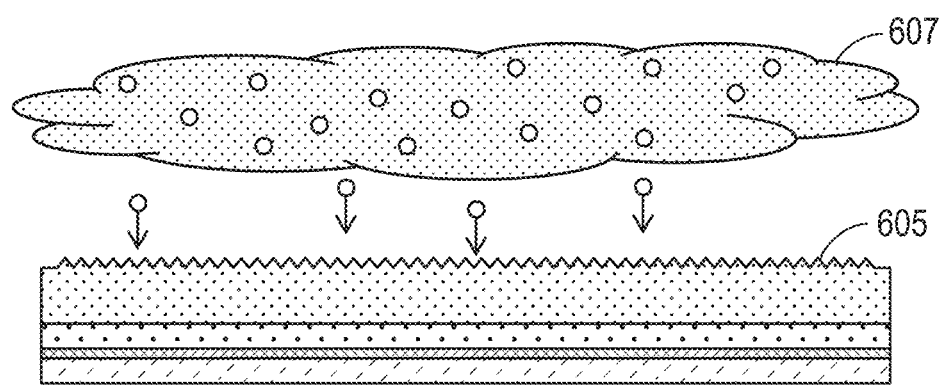
FIG. 6 shows a n-GaN surface etched by $SiCl_4$ plasma according to embodiments of the present invention.

FIG. 6 shows a n-GaN surface 605 etched by a $SiCl_4$ plasma 607 according to embodiments of the present invention. Although the $SiCl_4$-based plasma is described, there can be variations. As shown, the method treats the backside surface comprising the plurality of pyramid-like structures to a plasma treatment. The plasma can be created by applying a bias voltage across $SiCl_4$ gas. In this example, the subject plasma treatment processes the roughened GaN surface to achieve an ohmic contact. It is believed that the plasma surface treatment alters a chemical characteristic of the roughened GaN surface to facilitate the ohmic contact formation.

Figure 7:
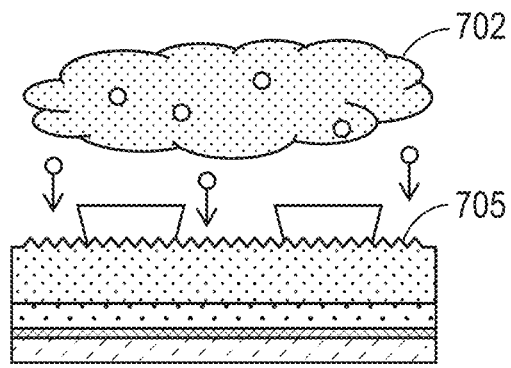
FIG. 7 shows an illustration of a photoresist-patterned substrate treated with an oxygen plasma, followed by a $SiCl_4$ plasma treatment (when the n-contacts will be patterned using a lift-off process) according to embodiments of the present invention.

FIG. 7 shows an illustration of a photoresist-patterned substrate treated with an oxygen plasma, followed by a $SiCl_4$ plasma treatment (when the n-contacts will be patterned using a lift-off process) according to an embodiment of the present invention. As shown, the photoresist patterned wafer 705 is exposed to an oxygen plasma 702, which removes residual organic contaminants in the contact windows. This is followed by a $SiCl_4$ plasma treatment. The present technique using the oxygen plasma provides a residue-free surface.

Figure 8A:
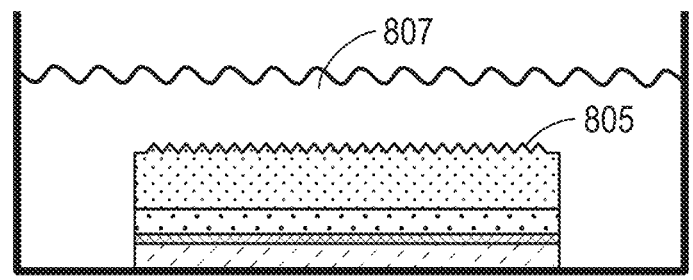
FIGS. 8A and 8B illustrate a process for hydrochloric acid (HCl) treatment of an n-GaN surface, with or without patterned photoresist, according to embodiments of the present invention.
Figure 8B:
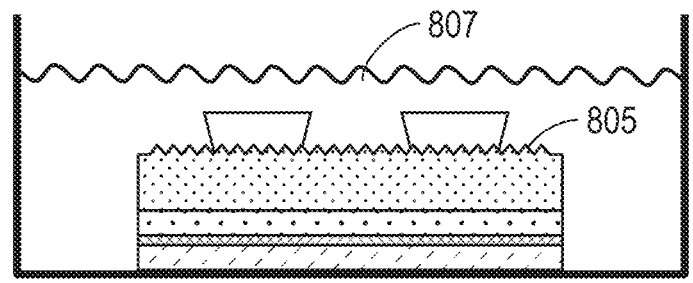

FIGS. 8A and 8B illustrate a process for HCl treatment of an n-GaN surface, with (FIG. 8A) or without (FIG. 8B) patterned photoresist according to embodiments of the present invention. The method subjects the n-GaN surface 805 to hydrochloric acid 807. Typically the HCl is an aqueous solution with a concentration of 38% by weight and may be diluted. Other treatments including acids of other types may be used. This surface treatment may be performed at room temperature or elevated temperatures, and extends for 1 minutes to 20 minutes in duration in an example. In this example, the subject acid treatment processes the roughened GaN surface to achieve an ohmic contact. It is believed that the acid treatment alters a chemical characteristic of the roughened GaN surface to facilitate ohmic contact formation.

FIGS. 9A and 9B are an illustrations of metal layers deposited on the n-GaN surface 905, without (FIG. 9A) and with (FIG. 9B) patterned photoresist. A stack or single layer begins with a first layer 906 of Al or Ti according to embodiments of the present invention. The stack can include any combination of suitable conductive materials with barrier and/or glue layers 907. The stack can be a homogeneous structure, a graded structure or composed of discrete stacked regions or any combination of the aforementioned and the like. Other suitable metals may be used, including Zn, Ag, Au, W, Cr, Ni, or others including, but not limited to, alloys. As shown, the method includes a blanket deposition of contact material comprising an aluminum bearing species or a titanium bearing species overlying the treated n-GaN surface to form a plurality of LED devices using this contact material.

FIG. 10 illustrates the resultant patterned metal on a substrate where organic solvents can be used to remove photoresist and unwanted metal in a liftoff process according to embodiments of the present invention. As an example, suitable solvents include N-methyl-2-pyrrolidone (NMP) or acetone followed by methanol and isopropanol. Other processes may be used to pattern the metal, including an etchback process.

FIG. 11 illustrates a process for metal annealing to lower the contact resistance according to embodiments of the present invention. The final contact structure is subjected to annealing in a nitrogen or forming gas (nitrogen and hydrogen) environment. The temperature can range from 200° C. to 450° C.

Figure 12:
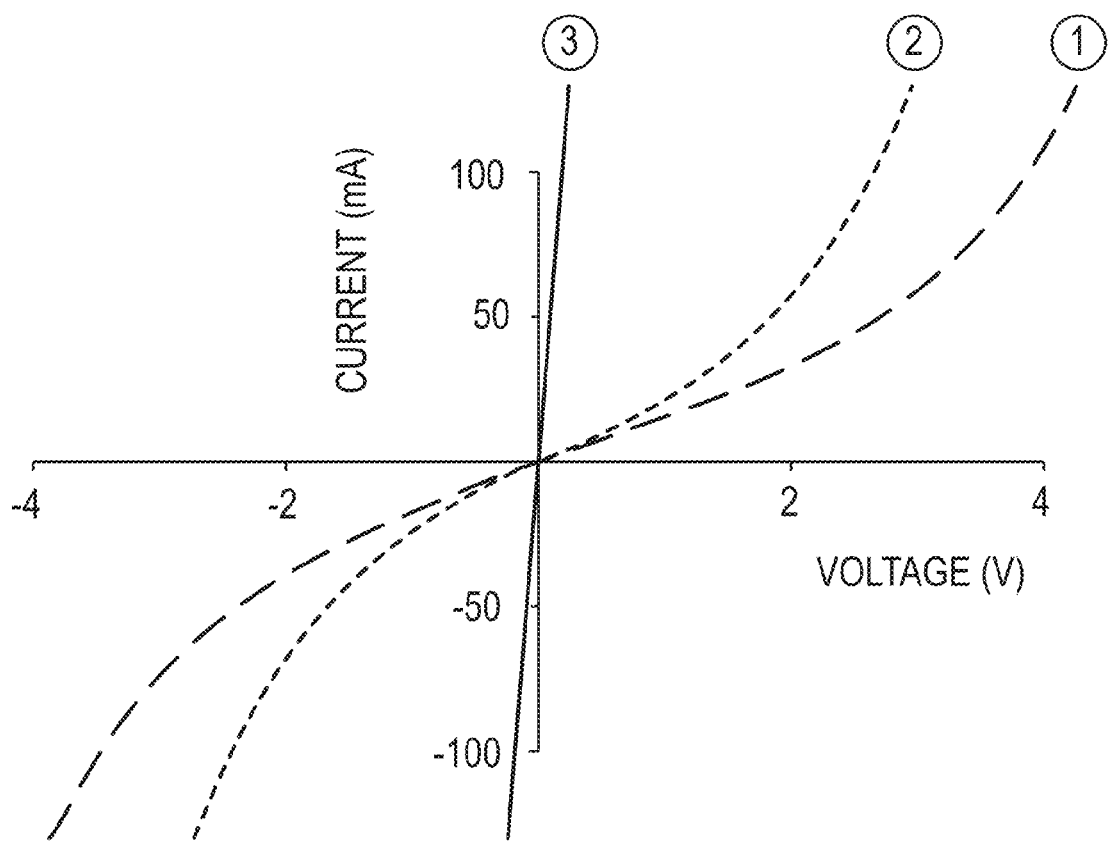
FIG. 12 illustrates an example of current as a function of voltage between two aluminum contacts on an n-GaN surface treated according to method provided by the present disclosure, compared to contacts to an untreated n-GaN surface.

FIG. 12 illustrates the current between two aluminum contacts on n-GaN for varying voltage. The first curve (1) shows a typical result when aluminum is placed on n-GaN without chemical roughening treatment or plasma exposure. The second curve (2) shows the improvement when the surface is exposed to silicic acid/KOH roughening solution, $SiCl_4$ plasma treatment, and HCl cleaning The third curve (3) shows the result when the contacts in curve 2 are annealed at 340° C. for 5 s. In an example, the diagram relates to current-voltage curves for a pair of aluminum contacts on n-GaN. Curve (1) contacts received no surface roughening or annealing. Curve (2) contacts were not annealed. Curve (3) contacts received the complete sequence of steps.

In an example, the present method includes the following sequence of steps.

(1) Lap and polish the nitrogen face of c-plane, n-type GaN with carrier concentration $1E18/cm^3$.

(2) Mix a silicic acid-potassium hydroxide solution, with the composition of 14.6 g of silicic acid hydrate, 20 mL of 45% KOH solution, and 100 mL of water.

(3) Immerse the substrate in the silicic acid-potassium hydroxide solution for 15 min at 60° C.

(4) Perform standard n-contact liftoff lithography.
 a. Lithography is not required except to form the contact pattern. This step may be omitted and a blanket deposition/etchback used.

(5) Descum (optional). May be ozone clean, oxygen plasma, or no treatment.

(6) Expose the sample to $SiCl_4$ plasma.
 a. Reactive ion etching at 400 W and 30 mTorr $SiCl_4$.

(7) Deionized water rinse.

(8) Immerse the sample in HCl (37%) for 5 min.

(9) Deionized rinse.

(10) Deposit contact metallization, such as evaporated aluminum, aluminum/nickel/gold, or titanium/gold.

(11) Anneal. Depending on the treatment conditions, contacts are ohmic as deposited, or mild annealing between 200° C. and 450° C. to produce ohmic contacts.

This sequence of steps is merely illustrative, and should not limit the scope of the claims herein. Depending upon the embodiment, the steps may be further combined, or other steps may be added. Alternatively, the steps may be reordered, depending upon the embodiment.

GaN substrates that underwent plasma exposure only, or acid clean only, had high-resistance contacts. Plasma exposures included both SiCl4 plasma and chlorine-based plasmas. Acid cleans included HCl, buffered oxide etch, and HF. GaN substrates with both plasma exposure and acid clean sometimes had ohmic contacts as deposited, but these changed to high-resistance contacts on mild annealing (340° C., 5 s). Substrates with alkaline clean, plus plasma treatment and acid dip, had generally high resistance contact as-deposited, but the contact resistance dropped below the current laser-scribed value after a 340° C., 5 s anneal. It should be understood that the description recited above is an example of the invention and that modifications and changes to the examples may be undertaken which are within the scope of the claimed invention. Therefore, the scope of the appended claims should be accorded the broadest interpretation so as to encompass all such modifications and similar arrangements, including a full scope of equivalents.

What is claimed is:

1. A light emitting diode (LED) device, comprising:
   a gallium and nitrogen containing substrate member comprising a backside surface and a front side surface, the front side surface comprising an n-type material overlying the substrate member, an active region overlying the n-type material, and a p-type material overlying the active region; and
   a plurality of pyramid-like structures distributed spatially in a non-periodic manner on the backside surface; and
   a contact material comprising an aluminum bearing species or a titanium bearing species overlying the plurality of pyramid-like structures,
   wherein the plurality of pyramid like structures comprises a surface treated with a plasma species followed by treatment with an acid.

2. The device of claim 1, wherein the backside surface is characterized by a nitrogen face of a c-plane and an n-type GaN with a carrier concentration from $1E15/cm^3$ to $1 E20/cm^3$.

3. The device of claim 1, wherein each of the plurality of pyramid-like structures is characterized by a height from 20 nm to 1000 nm.

4. The device of claim 1, wherein the active region is configured to emit electromagnetic radiation in a range of 450 nm to 480 nm.

5. The device of claim 1, wherein the active region comprises a plurality of quantum well structures.

6. The device of claim 1, wherein each of the plurality of pyramid-like structures comprises three sides.

7. The device of claim 1, wherein each of the plurality of pyramid-like structures comprises two or more sides.

8. The device of claim 1, wherein the plasma species is a $SiCl_4$ plasma.

9. The device of claim 1, wherein the acid is hydrochloric acid.

* * * * *